(12) United States Patent
Sim (10) Patent No.: US 7,652,925 B2
(45) Date of Patent: Jan. 26, 2010

(54) FLASH MEMORY DEVICE AND PROGRAM METHOD THEREOF

(75) Inventor: Sang-Pil Sim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 28 days.

(21) Appl. No.: 12/144,925

(22) Filed: Jun. 24, 2008

(65) Prior Publication Data

US 2008/0253194 A1 Oct. 16, 2008

Related U.S. Application Data

(62) Division of application No. 11/616,322, filed on Dec. 27, 2006, now Pat. No. 7,397,704.

(30) Foreign Application Priority Data

Oct. 23, 2006 (KR) ............................. 2006-103057

(51) Int. Cl.
*G11C 16/00* (2006.01)
(52) U.S. Cl. ........................... 365/185.19; 365/185.22; 365/185.28
(58) Field of Classification Search .............. 365/185.19
See application file for complete search history.

(56) References Cited

U.S. PATENT DOCUMENTS

| 5,574,684 | A | 11/1996 | Tomoeda |
| 5,828,604 | A | 10/1998 | Kawai et al. |
| 5,889,701 | A | 3/1999 | Kang et al. |
| 6,829,172 | B2 * | 12/2004 | Bloom et al. .......... 365/185.22 |
| 6,903,978 | B1 * | 6/2005 | Mirgorodski et al. .. 365/185.28 |
| 7,023,737 | B1 | 4/2006 | Wan et al. |
| 7,038,949 | B2 | 5/2006 | Chae et al. |
| 7,342,833 | B2 * | 3/2008 | Cavins et al. .......... 365/185.28 |

FOREIGN PATENT DOCUMENTS

| JP | 11-110977 | 4/1999 |
| KR | 1020050068554 A | 7/2005 |
| KR | 1020050116283 A | 12/2005 |
| KR | 1020060037648 A | 5/2006 |
| KR | 10-20050106277 A | 11/2006 |

* cited by examiner

*Primary Examiner*—Tan T. Nguyen
(74) *Attorney, Agent, or Firm*—F. Chau & Associates, LLC (57) ABSTRACT

A method of programming a plurality of memory cells in a flash memory device from a first state to a second state includes verifying the plurality of memory cells using a verify voltage having a level increased according to an increase in a program loop number; and programming the plurality of memory cells using a program voltage having an increment decreased according to an increase in the program loop number, wherein the verifying and programming steps constitute a program loop, the program loop being terminated at a point in time when a level of the verify voltage reaches to a voltage range of the second state.

12 Claims, 8 Drawing Sheets

FLASH MEMORY DEVICE AND PROGRAM METHOD THEREOF

CROSS-REFERENCE TO RELATED APPLICATION

This is a divisional application of U.S. application Ser. No. 11/616,322, filed Dec. 27, 2006, now U.S. Pat. No. 7,397,704, and which claims foreign priority under 35 U.S.C. § 119 to Korean Patent Application No. 2006-103057 filed Oct. 23, 2006, which is hereby incorporated by reference for all purposes as if fully set forth herein.

BACKGROUND OF THE INVENTION

The present disclosure relates to a semiconductor memory device and, more particularly, to a flash memory device capable of reducing the coupling between adjacent memory cells in the same row of the memory device.

In recent years, applications for storage devices such as volatile memories and non-volatile memories have been rapidly spreading to mobile devices, such as MP3 players, PMPs, cellular phones, notebook computers, PDAs, and the like. Such mobile devices typically require mass storage devices to provide their various functions, for example, a moving figure reproducing function. Many efforts have been made to satisfy such storage requirements. As one of such efforts, a multi-bit memory device has been proposed that stores 2-bit data or more data bits per cell. In the following a memory cell storing multi-bit data is called an MLC, and the mass storage devices can be implemented to integrate more memory cells per unit area according to advances in process technologies.

In the case of designing the MLC flash memory device, narrower threshold voltage distributions are required in order to secure wider read margins. In accordance with a well-known Incremental Step Pulse Programming (ISPP) technique, before performing the ISPP, a step-shape voltage is applied to a word line in order to shift the threshold voltages of the memory cells into a target threshold voltage. This is called a "convergence program operation". After the convergence program operation, the memory cells are programmed to have threshold voltages that are equal to or higher than a verify voltage.

Figure 1A:
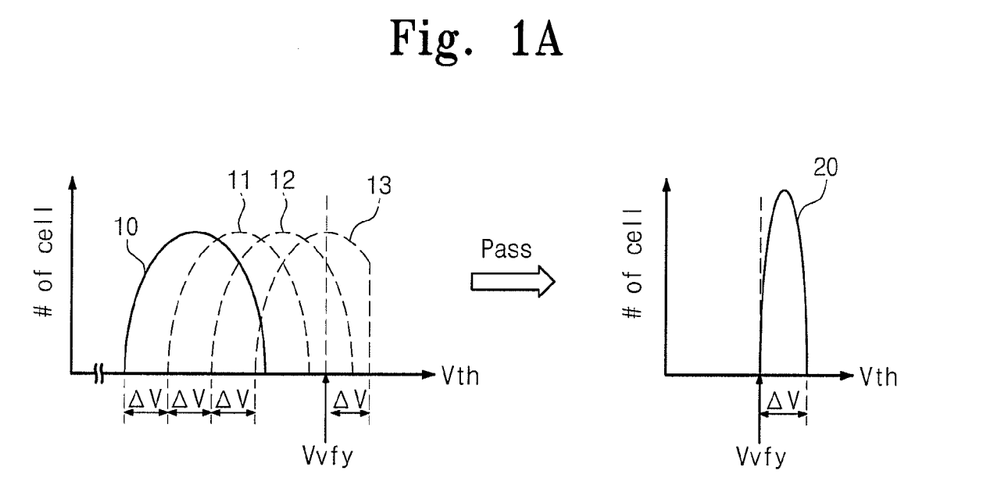
FIG. 1A is a diagram for use in describing a program method according to a conventional flash memory device.

FIG. 1A is a diagram for use in describing a program method according to a conventional flash memory device.

Referring to FIG. 1A, memory cells in a threshold voltage distribution 10 are programmed to have a threshold voltage distribution 20 using pulse voltages of a constant increment. A threshold voltage may be shifted through F-N tunneling in the case of a NAND flash memory and through CHE injection in the case of a NOR flash memory device. The threshold voltage distribution 10 indicates a distribution after the convergence program operation. As a pulse voltage with an increment $\Delta V$ of a constant magnitude is applied to a selected word line, a threshold voltage distribution of the memory cells may be shifted in this order of 10→11→12→13→ . . . →20, as shown in FIG. 1A. In an ideal case, a final width of the threshold voltage distribution 20 of programmed memory cells may become $\Delta V$.

Figure 1B:
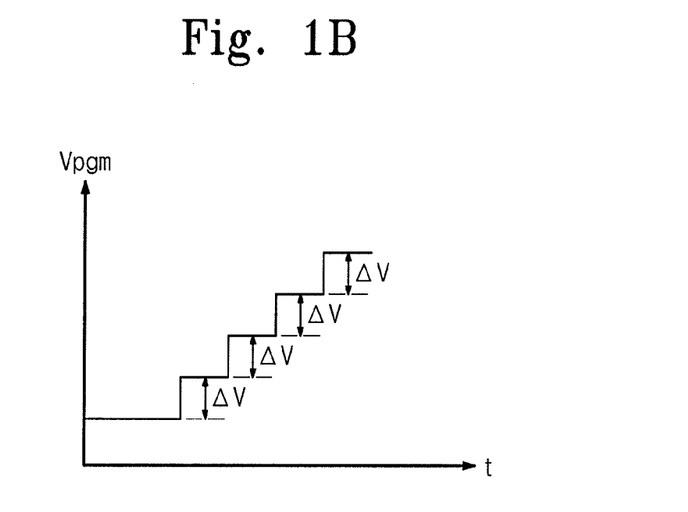
FIG. 1B is a diagram showing a variation of a program voltage applied to a selected word line.

FIG. 1B is a diagram showing a variation of a program voltage applied to a selected word line. Referring to FIG. 1B, in order to obtain the final threshold voltage distribution 20 in FIG. 1A, a program voltage with a constant increment $\Delta V$ has to be applied to a selected word line. Then, whenever the program voltage is applied to the selected word line, a verify operation is carried out to confirm whether the memory cells of the selected word line are programmed, with a verify voltage being applied to the selected word line. When a result indicative of a program passage is obtained, the program operation may be ended.

On the other hand, a threshold voltage distribution 10 obtained after performing the convergence program operation may be widened in the event that the degree of integration is increased and the memory cells are shrunk. An increment of the program voltage may be reduced in order to make the widened threshold voltage distribution become programmed to have a threshold voltage distribution having a sufficient read margin. In the event that the increment is reduced, the threshold voltage distribution can be improved. On the other hand, a decrease in the increment causes an increase in the number of pulses. This forces a program loop number to increase. Accordingly, program speed is remarkably reduced.

As well known in the art, a flash memory device such as a NAND flash memory device has a relatively slower program speed than that of other memory devices. Accordingly, there are required a method and device that are capable of increasing the program speed through a decrease in a program pulse number, that are capable of securing sufficient read margins, and that are capable of guaranteeing a threshold voltage distribution.

SUMMARY OF THE INVENTION

Exemplary embodiments of the present invention are directed to a method of programming a plurality of memory cells in a flash memory device from a first state to a second state. The method comprises verifying the plurality of memory cells using a verify voltage having a level increased according to an increase in a program loop number; and programming the plurality of memory cells using a program voltage having an increment decreased according to an increase in the program loop number, wherein the verifying and programming steps constitute a program loop, the program loop being terminated at a point of time when a level of the verify voltage reaches a voltage range of the second state.

Exemplary embodiments of the present invention are directed to a method of programming a plurality of memory cells in a flash memory device from a target state being between a first voltage and a second voltage. The method comprises a) programming the plurality of memory cells to a first state lower than the target state; b) verifying the plurality of memory cells using a first verify voltage within a range of the first state; c) programming memory cells, judged as a failed cell according to a verification result, using a program voltage increased by an increment corresponding to a difference between the second voltage and the verify voltage; and d) verifying the plurality of memory cells using a second verify voltage within a threshold voltage state determined according to step (c), wherein the (c) and (d) steps constitute a program loop, the program loop being repeated until the plurality of memory cells are programmed to have the target state.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

The present invention will now be described more fully hereinafter with reference to the accompanying drawings, in which exemplary embodiments of the invention are shown. This invention, however, may be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, like numbers refer to like elements throughout.

Figure 2:
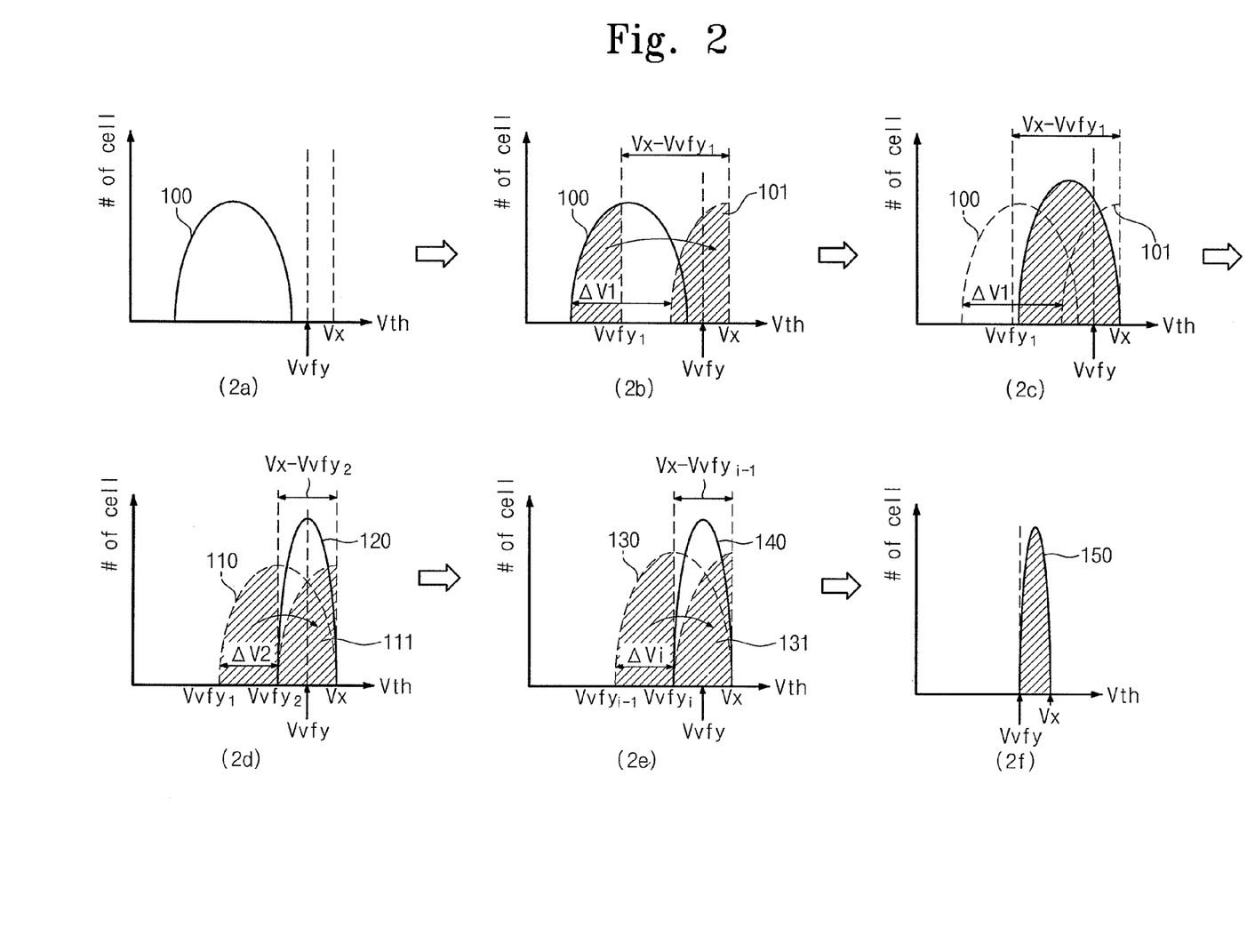
FIG. 2 are diagrams for use in describing a program method of a flash memory device according to an exemplary embodiment of the present invention.

FIG. 2 are diagrams for use in describing a programming method of a flash memory device according to an exemplary embodiment of the present invention. An operation of programming memory cells will be described with reference to diagrams (2a) to (2f) making up FIG. 2.

A distribution in (2a) of FIG. 2 indicates a threshold voltage distribution of memory cells according to a result of a convergence program operation. After the convergence program operation, threshold voltages of the memory cells are distributed within a threshold voltage distribution 100 in (2a) of FIG. 2. This threshold voltage distribution 100 may be shifted over a verify voltage Vvfy through the following ISPP. In a threshold voltage distribution of memory cells after the completion of the program operation, a reference voltage Vx for indicating an upper limit value may be defined. If the program operation is ended, threshold voltages of the memory cells may be distributed between the reference voltage Vx and the verify voltage Vvfy.

A distribution shown in (2b) of FIG. 2 is used to describe a verify operation using a first verify voltage Vvfy1 and a program operation for failed memory cells, with respect to memory cells in which a convergence program operation thereof is completed. First of all, memory cells in the threshold voltage distribution 100 are divided into failed memory cells and passed memory cells using the first verify voltage Vvfy1. In general, the first verify voltage Vvfy1 may be set to an intermediate voltage value of the threshold voltage distribution 100. But, it will be apparent to one skilled in the art that the first verify voltage Vvfy1 is not limited to this disclosure. Among memory cells in the threshold voltage distribution, memory cells distributed below the first verify voltage Vvfy1 may be programmed using a program voltage Vpgm having a first increment $\Delta V1$. In an ideal case, memory cells (included in a hatched portion in FIG. 2) distributed below the first verify voltage Vvfy1 may be shifted within a threshold voltage distribution 101 when a program voltage Vpgm is applied. The program voltage Vpgm is a voltage higher by the first increment $\Delta V1$ than a final program voltage supplied at the convergence program operation. The first increment $\Delta V1$ corresponds to a difference between the reference voltage Vx and the first verify voltage Vvfy1. Herein, a magnitude of the first increment $\Delta V1$ has a value of (Vx−Vvfy1). After a program voltage increased by the first increment $\Delta V1$ is supplied, a threshold voltage distribution of memory cells includes memory cells passed at a previous verify operation and memory cells programmed in the threshold voltage distribution 101. Accordingly, threshold voltages of memory cells may form a threshold voltage distribution illustrated in (2c) in FIG. 2.

Furthermore, as illustrated in (2d in FIG. 2), memory cells programmed within a threshold voltage distribution 110 are verified using a second verify voltage Vvfy2, and programmed using a program voltage increased by a second increment $\Delta V2$. At this time, the second verify voltage Vvfy2 may be set to an intermediate value between the reference voltage Vx and the first verify voltage Vvfy1. Alternatively, the second verify voltage Vvfy2 may be set to a voltage lower by a predetermined value than the intermediate value so that failed memory cells are all programmed by applying a program voltage Vpgm once. As a program voltage increased by the second increment is supplied, threshold voltages of memory cells judged as a failed cell by the second verify voltage Vvfy2 may be shifted into a threshold voltage distribution 111. Accordingly, the threshold voltage distribution 120 is formed of memory cells (at a right side of a distribution 110) passed by the second verify voltage Vvfy2 and memory cells (distributed within the distribution 111) programmed according to the second increment $\Delta V2$.

A distribution 140 in (2e) of FIG. 2 illustrates a program operation with respect to memory cells judged as a failed cell according to the above-described verify and program operations. In particular, the distribution 130 shown in (2e) of FIG. 2 shows a verify voltage Vvfyi and a variation of an increment of a program voltage. A verify voltage Vvfyi is set to an intermediate value between the reference voltage Vx and a previous verify voltage Vvfyi−1 every loop/step. An increment of a program voltage corresponds to a difference of the reference voltage Vx and a previous verify voltage Vvfyi−1. That is, in an ith step/loop, Vvfyi=(Vx−Vvfyi−1)/2 and $\Delta Vi$= (Vx−Vvfyi−1).

In accordance with a program method of an exemplary embodiment of the present invention, a verify operation is carried out with the above-defined verify voltage Vvfyi, and a program operation is carried out using a program pulse increased by the above-defined increment $\Delta Vi$. Accordingly, as a step/loop number is increased, the program and verify voltages are increased in a log scale.

A program operation using the verify and program voltages increased in the log scale may be ended when a verify voltage is over a target verify voltage Vvfy. That is, if a condition of (Vvfyi≧Vvfy) is satisfied, a program operation is ended, and the same threshold voltage distribution 150 as illustrated in (2f) of FIG. 2 is formed.

In accordance with the program method of an exemplary embodiment of the present invention, a program voltage Vpgm and a verify voltage Vvfyi are varied in a large increment. On the other hand, the increment is decreased as a threshold voltage distribution of memory cells comes closer to a target verify voltage Vvfy. Accordingly, the number of pulses needed for a program operation can be reduced with widening of a threshold voltage distribution being suppressed. As a result, the program method according to an exemplary embodiment of the present invention can improve a program speed of a flash memory device.

Figure 3:
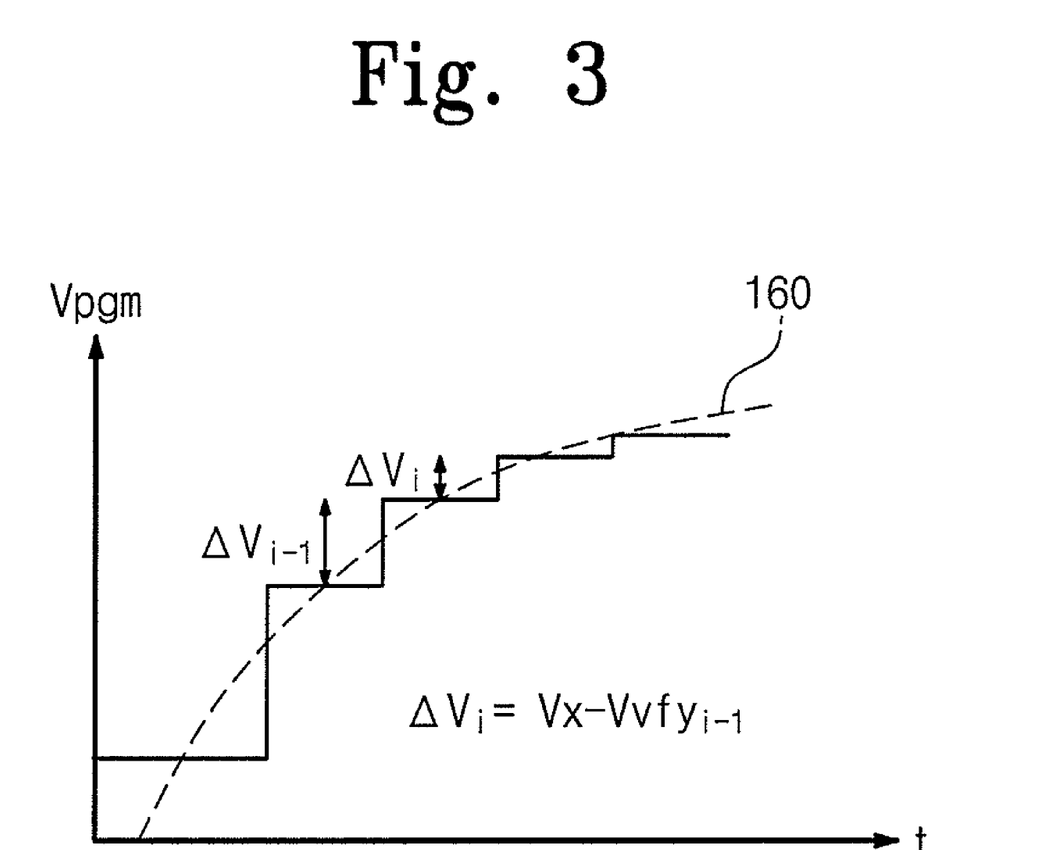
FIG. 3 is a diagram showing a variation of a program voltage according to an exemplary embodiment of the present invention.

FIG. 3 is a diagram showing a variation of a program voltage according to an exemplary embodiment of the present invention.

Referring to FIG. 3, an increment of a program voltage is reduced as a program step/loop is repeated. Accordingly, a variation of threshold voltages of memory cells is increasingly reduced upon repetition of the program steps/loops, so that it is possible to finely control a threshold voltage distribution. An increasing aspect of a program voltage is expressed by a dotted line 160 as illustrated in FIG. 3.

In accordance with a program method of the present invention described in FIGS. 2 and 3, a verify operation is carried out using a first verify voltage Vvfy1 with respect to a result of a convergence program operation. It is possible to reduce a step/loop number needed for an overall program operation by means of a program operation, which uses a program voltage Vpgm having an increment that is gradually decreased, and a verify operation, which uses a verify voltage Vvfyi having an increment that is gradually decreased. Assuming that a characteristic of the memory cells is ideal, after the above-described step/loop is repeated N times, a threshold voltage distribution may be reduced by $0.5^N$ times as compared with a distribution 100 shown at (2a) in FIG. 2 obtained according to a convergence program operation.

Figure 4:
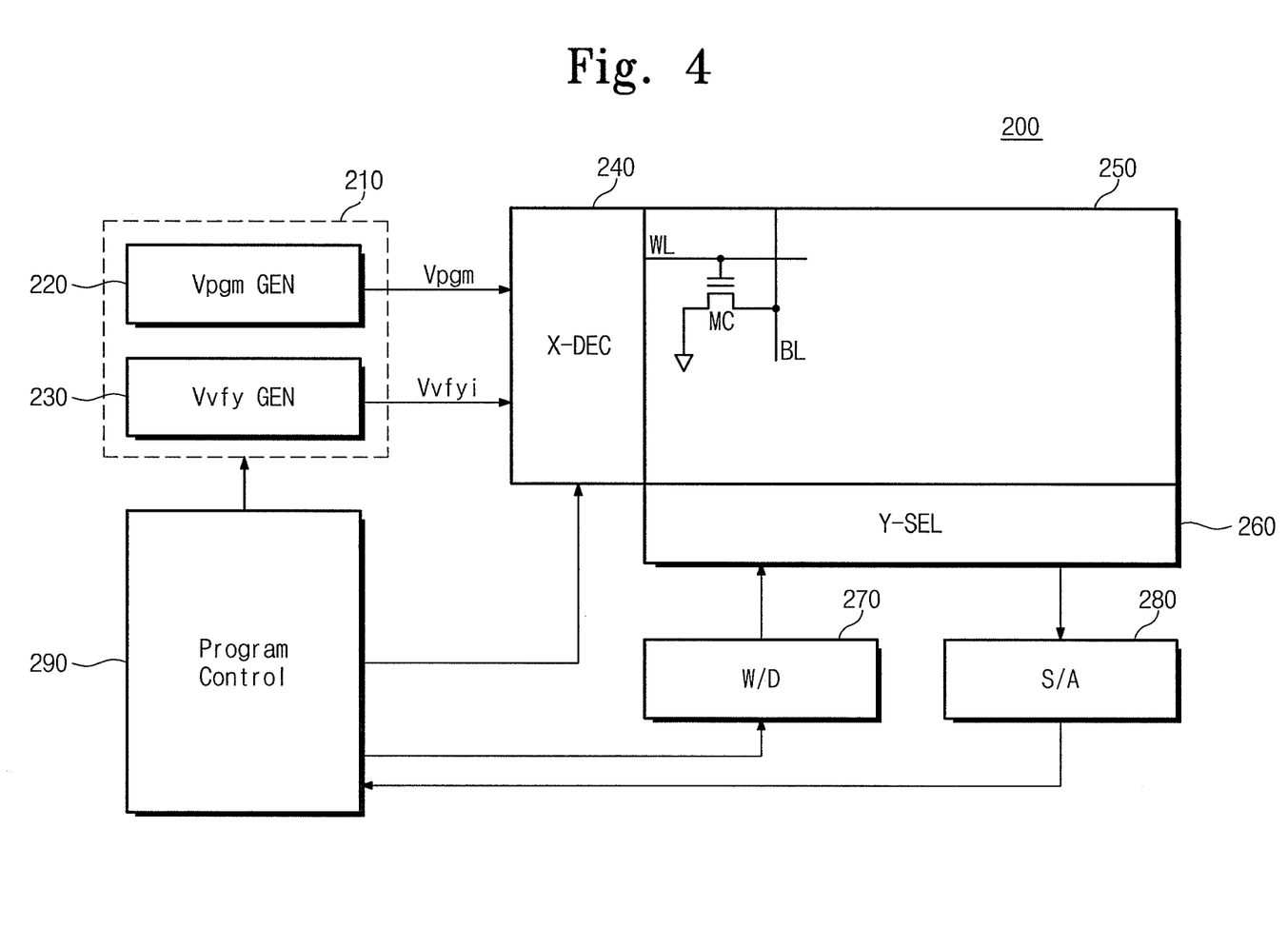
FIG. 4 is a block diagram showing a flash memory device according to an exemplary embodiment of the present invention.

FIG. 4 is a block diagram showing a flash memory device according to an exemplary embodiment of the present invention.

Referring to FIG. 4, a flash memory device 200 according to an exemplary embodiment of the present invention includes a program voltage generator circuit 220 and a verify voltage generator circuit 230 for generating a program voltage Vpgm and a verify voltage Vvfyi, which are increased in a log scale, to be supplied to a word line WL.

More specifically, a voltage generator block 210 generates a high voltage used within the flash memory device 200. In general, circuits included within the voltage generator block 210 generate a high voltage Vpp and a program voltage Vpgm using a power supply voltage Vcc through charge pump circuits. In the exemplary embodiment of the present invention, configurations for generating only two voltages are illustrated in FIG. 4 because there is described a program method using a program voltage Vpgm and a verify voltage Vvfy.

A program voltage generator 220 generates the program voltage Vpgm that is supplied to a control gate of a memory cell. The program voltage generator 220 generates the program voltage Vpgm having a level corresponding to each step/loop in response to the control of a program control 290. While a program loop is increased, the program voltage generator 220 generates the program voltage Vpgm that is increased by an increment $\Delta V_i$ that is gradually decreased.

A verify voltage generator 230 generates the verify voltage Vvfyi for verifying whether memory cells are programmed, in response to the control of the program control 290. The verify voltage Vvfyi may be supplied to a word line connected with the programmed memory cells after a program operation is performed. In general, a verify voltage is fixed. On the other hand, in the case of an exemplary embodiment of the present invention, the verify voltage Vvfyi((Vx−Vvfyi−1)/2) is increased in a log scale every loop/step as described above.

A row decoder circuit 240 supplies a selected word line with the program voltage Vpgm or the verify voltage Vvfyi based on the control of the program control 290. Although not shown in the figures, the row decoder circuit 240 may select a word line in response to a row address transferred via an address input circuit. The row decoder circuit 240 supplies the program voltage Vpgm or the verify voltage Vvfyi to the selected word line.

A cell array 250 comprises memory cells MC that are arranged in word lines and bit lines. Although the memory cells MC of the cell array 250 are arranged in a NOR structure, the present invention is not limited to this exemplary embodiment. For example, it will be apparent to one skilled in the art that a program method according to the present invention is not limited to a NAND flash memory device. In the event that the program voltage Vpgm is applied to a selected word line in order to shift threshold voltages of memory cells toward a higher side, memory cells of the NAND flash memory device may be programmed in the F-N tunneling manner, and memory cells of the NOR flash memory device may be programmed in the CHE injection manner.

A column selector circuit 260 selects bit lines of the cell array in response to a column address transferred via an address input circuit (not shown). A write driver circuit 270 transfers externally supplied data to the selected bit lines in response to the control of the program control 290 at a program operation. In particular, at the program operation, the write driver circuit 270 supplies a bit line voltage of about 5V to bit lines connected with memory cells to be programmed, so as to effectively generate the CHE injection.

A sense amplifier circuit 280 reads out data from selected memory cells via the column selector circuit 260 at a read operation. At a program operation, the sense amplifier circuit 280 reads out data from programmed memory cells with a verify voltage Vvfyi being applied to a selected word line, and transfers the read data to the program control 290.

The program control 290 selects programmed cells based on data from the sense amplifier 280 at a program operation. As described in connection with what is shown in FIG. 2, when a verify voltage Vvfyi is applied to a selected word line and data of memory cells in the selected word line is sensed by the sense amplifier circuit 280, memory cells disposed below the verify voltage Vvfyi may be selected as program target cells. The program control 290 controls the write driver circuit 270 so as to bias bit lines of the program target cells. At the same time, the program control 290 controls the program voltage generator circuit 220 so as to generate a program voltage Vpgm corresponding to each loop/step.

In the case of the flash memory device 200 according to an exemplary embodiment of the present invention, it is possible to perform a fast program operation and control a threshold voltage distribution narrowly by using the program and to verify voltages Vpgm and Vvfyi that are increased in a log scale.

Figure 5:
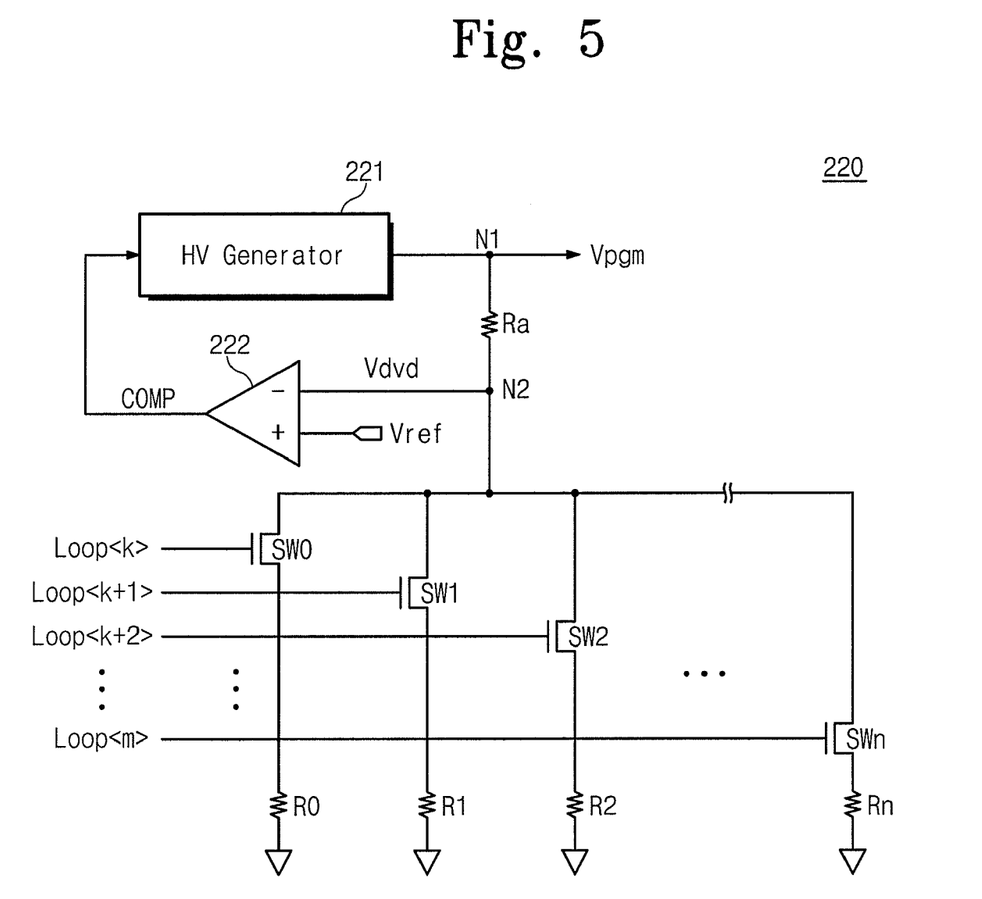
FIG. 5 is a circuit diagram showing in more detail a program voltage generator used in the system of FIG. 4 according to an exemplary embodiment of the present invention.

FIG. 5 is a circuit diagram showing a program voltage generator used in the system of FIG. 4 according to an exemplary embodiment of the present invention.

Referring to FIG. 5, a program voltage generator 220 is configured to generate a program voltage Vpgm according to a voltage that is divided by a upper resistor Ra and one of several lower resistors R0-Rn selected by loop count signals Loop<k>-Loop<m>. The loop count signals Loop<k>-Loop<m> are provided from a program control 290 shown in FIG. 4. The lower resistors R0-Rn may have resistance values for providing a program voltage of a log scale based on an increment $\Delta V_i$ whose magnitude is decreased as a loop number is increased. The program voltage generator 220 outputs the program voltages Vpgm in response to a loop count signal Loop<i> that is activated by the program control 290. The program voltage Vpgm with an increment $\Delta V_i$ having different levels every loop is generated according to a voltage divided by the upper resistor Ra and one resistor of the lower resistors R0-Rn selected by an activated loop count signal Loop<i>.

In operation, a divided voltage Vdvd at a node N2 is input to an inverted terminal of a comparator 222, and a reference voltage Vref is input to a non-inverted terminal thereof. In the event that the divided voltage Vdvd is lower than the reference voltage Vref, the comparator 222 activates a comparison signal COMP at a high level. When the comparison signal COMP is activated, a high voltage generator 221 performs a pump operation to output a desired program voltage Vpgm. These operations are continuously conducted in accordance with loop count signals Loop<k>-Loop<m> that are activated sequentially. The program voltage generator 220 generates the program voltage Vpgm that has an increment $\Delta Vi$ that is varied differently every loop. Generation of the program voltage Vpgm increased in a log scale may be based on resistance values of the lower resistors R0-Rn.

Figure 6:
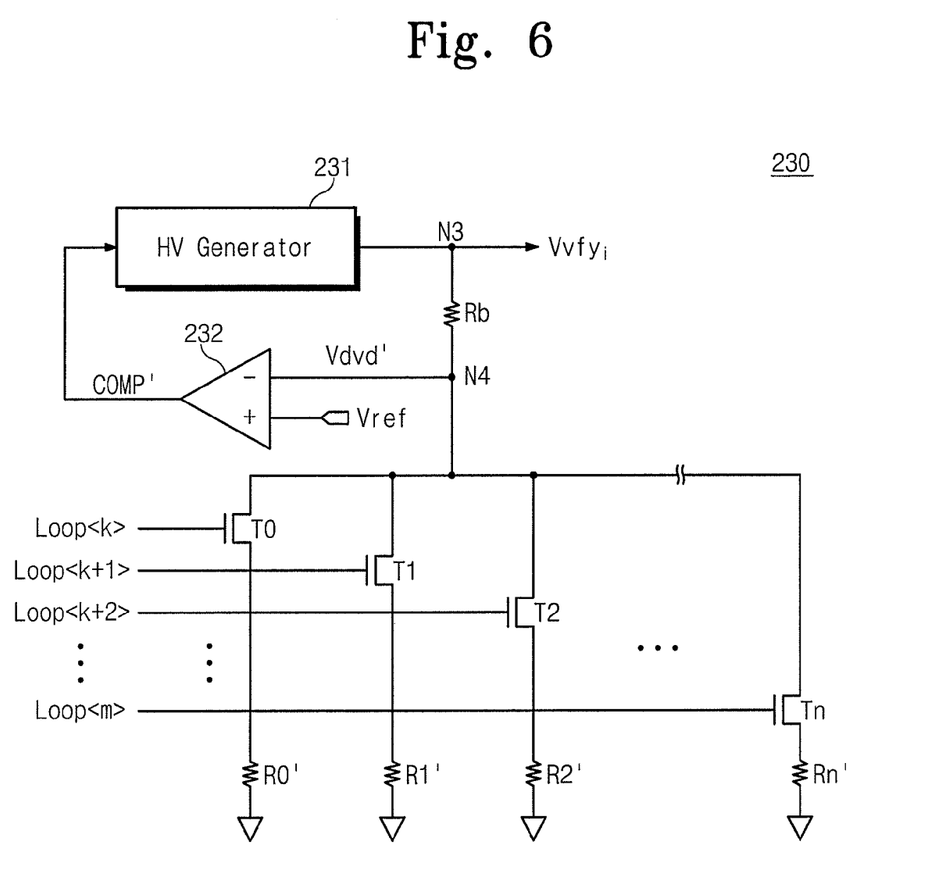
FIG. 6 is a circuit diagram showing in more detail a verify voltage generator used in the system of FIG. 4 according to an exemplary embodiment of the present invention.

FIG. 6 is a circuit diagram showing a verify voltage generator used in the system of FIG. 4 according to an exemplary embodiment of the present invention.

Referring to FIG. 6, a verify voltage generator 230 is configured to generate a verify voltage Vvfyi according to a voltage that is divided by an upper resistor Rb and one of several lower resistors R0'-Rn' that are selected by loop count signals Loop<k>-Loop<m>. The loop count signals Loop<k>-Loop<m> are provided from the program control 290 shown in FIG. 4. The lower resistors R0-Rn may have resistance values for providing a verify voltage Vvfyi of a log scale as a loop number is increased.

In operation, a divided voltage Vdvd' at a node N4 is input to an inverted terminal of a comparator 232, and a reference voltage Vref is input to a non-inverted terminal thereof. In the event that the divided voltage Vdvd' is lower than the reference voltage Vref, the comparator 232 activates a comparison signal COMP' at a high level. When the comparison signal COMP' is activated, a high voltage generator 231 performs a pump operation to output a desired verify voltage Vvfy'. These operations are continuously conducted in accordance with loop count signals Loop<k>-Loop<m> that are activated sequentially. The verify voltage generator 230 generates the verify voltage Vvfyi that has an increment $\Delta Vi$ whose magnitude is gradually decreased. Generation of the verify voltage Vvfyi that increases in a log scale may be based on resistance values of the lower resistors R0-Rn.

The flash memory device according to an exemplary embodiment of the present invention includes a program voltage generator 220 and a verify voltage generator 230 that generate a program voltage Vpgm and a verify voltage Vvfyi so as to increase in a log scale. The program voltage Vpgm and the verify voltage Vvfyi are in turn supplied to a selected word line under the control of the program control 290 shown in FIG. 4.

Figure 7:
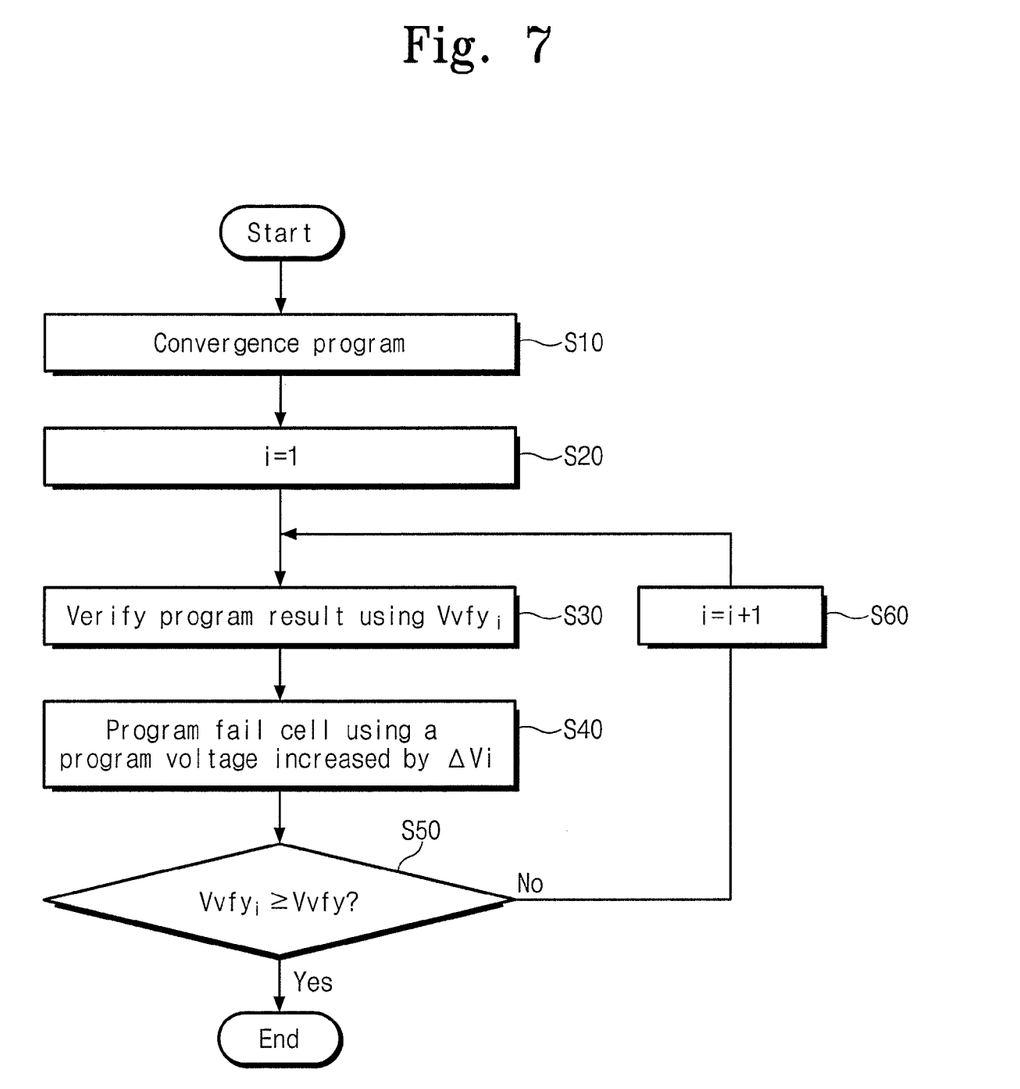
FIG. 7 is a flowchart for use in describing a program method of a flash memory device according to an exemplary embodiment of the present invention.

FIG. 7 is a flowchart for describing a program method of a flash memory device according to an exemplary embodiment of the present invention. A program method of a flash memory device according to an exemplary embodiment of the present invention will be more fully described hereinafter with reference to the accompanying drawings.

Referring to FIG. 7, in step S10, there is carried out a convergence program operation for making a relatively widened threshold voltage distribution (100 in FIG. 2). A verify operation is carried out using a first verify voltage Vvfy1 with respect to the threshold voltage distribution 100 formed according to the convergence program operation, and an initialization operation is performed to apply a program voltage Vpgm increased by a first increment $\Delta V1$. That is, in step S20, an operation for selecting the first verify voltage Vvfy1 and the first increment $\Delta Vi$ is carried out by the program control 290 of FIG. 4. After the first verify voltage Vvfy1 is selected, the program control part 290 activates one of the loop count signals Loop<k>-Loop<m>, which is to be supplied to the verify voltage generator 230, so as to generate the first verify voltage Vvfy1. In step S30, the program control 290 performs a verify operation where the first verify voltage Vvfy1 is supplied to a selected word line and a sensing signal is generated by the sense amplifier circuit 280. In step S40, the program control 290 programs memory cells judged as a failed cell at a previous verify period using a program voltage increased by the first increment $\Delta V1$. In step S50, the program control 290 compares the verify voltage Vvfy1 and a target verify voltage Vvfy. Based on the comparison result, the program control 290 either ends the program operation or continues to perform the program operation. If the first verify voltage Vvfy1 is lower than the target verify voltage Vvfy, in step S60, a loop/step count number is increased by 1 to perform the program operation using a second verify voltage Vvfy2 and a second increment $\Delta V2$. Afterwards, the procedure goes to the step S30 where a verify operation may be performed using the second verify voltage Vvfy2. These operations may be repeated until a verify voltage Vvfyi reaches the target verify voltage Vvfy. If the verify voltage Vvfyi is equal to or higher than the target verify voltage Vvfy, the procedure is ended.

In accordance with the program method of an exemplary embodiment of the present invention, it is possible to improve a threshold voltage distribution of memory cells and to improve a program speed.

Figure 8:
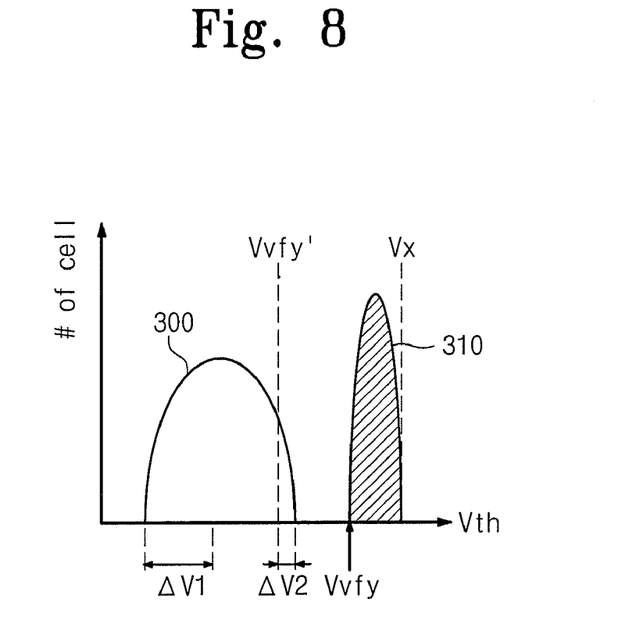
FIG. 8 is a diagram for use in describing an exemplary embodiment of the present invention.

FIG. 8 is a diagram for describing an exemplary embodiment according to the present invention. In practice, it is difficult to reduce an increment of a voltage pulse regularly and to finely generate program and verify voltages Vpgm and Vvfyi being increased in a log scale. Accordingly, it is possible to perform a program operation using two or three types of step voltages.

Referring to FIG. 8, after a convergence program operation, memory cells within a threshold voltage distribution 300 are programmed using a program voltage that is increased by a first increment $\Delta V1$. In this case, a verify operation is carried out using a predetermined verify voltage Vvfy'. A period where a program operation is carried out using a program voltage increased by the first increment $\Delta V1$, is called a first program period. A period where a program operation is carried out using a program voltage increased by a second increment $\Delta V2$ lower than the first increment $\Delta V1$, is called a second program period. A verify operation of the second program period is performed using a verify voltage Vvfy. If a program operation is passed within the second program period, a threshold voltage distribution of memory cells may become a distribution 310. Herein, the magnitude of the first increment $\Delta V1$ may be set to a voltage corresponding to a difference between the reference voltage Vx and a verify voltage Vvfy' used in the first program period.

Figure 9:
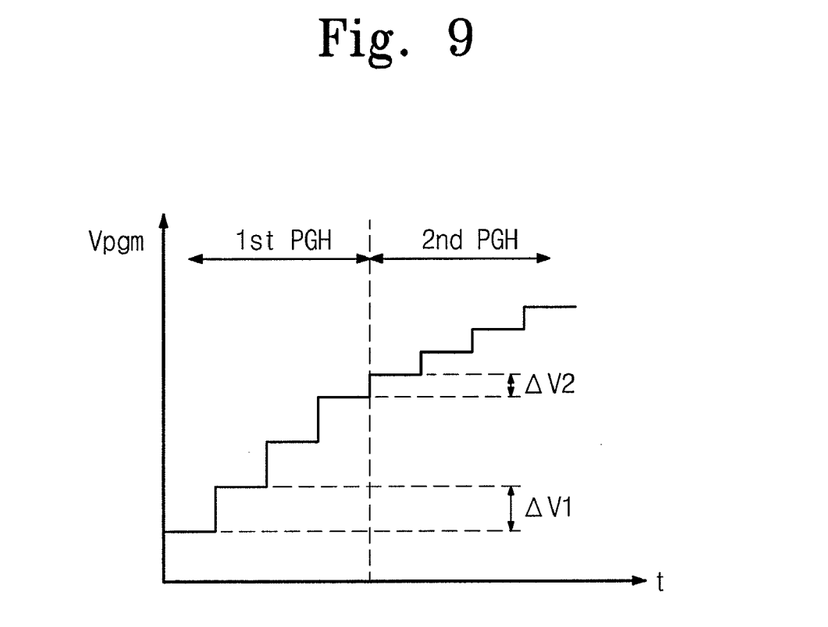
FIG. 9 is a diagram showing a variation of a program voltage when a two-step program scheme described in FIG. 8 is used.

FIG. 9 is a diagram showing a variation of a program voltage when a two-step program scheme described in FIG. 8 is used. The program voltage generator 220 shown in FIG. 4 increases a program voltage Vpgm by an increment $\Delta V1$ within a first program period. The program voltage generator 220 increases the program voltage Vpgm by an increment $\Delta V2$ within a second program period. The magnitude of the increment $\Delta V2$ is more than that of the increment $\Delta V1$.

Although a two-step program scheme is used for convenience of description, the present invention is not limited to this exemplary embodiment. For example, it will be apparent to one skilled in the art that three or more increments are used for the program method according to the present invention.

Although the present invention has been described in connection with the exemplary embodiments of the present invention illustrated in the accompanying drawings, it is not limited thereto. It will be apparent to those skilled in the art that various substitution, modifications and changes may be thereto without departing from the scope and spirit of the invention.

What is claimed is:

1. A method of programming a plurality of memory cells in a flash memory device from a first state to a second state, the second state being between a first voltage and a second voltage, the method comprising:
    verifying the plurality of memory cells using a verify voltage included within a voltage range of the first state; and
    programming memory cells, each judged as a failed cell according to a verification result, using a program voltage increased by a voltage corresponding to a difference between the second voltage and the verify voltage.

2. The method of claim 1, wherein the verify voltage has a voltage level corresponding to an intermediate value of the voltage range of the first state.

3. The method of claim 1, wherein the verify voltage has a voltage level between a minimum value and an intermediate value of the voltage range of the first state.

4. The method of claim 1, wherein the verifying and programming steps constitute a program loop, which is repeated until the plurality of memory cells are all programmed to have the second state.

5. The method of claim 4, wherein the second voltage is a maximum value of a voltage range of the second state.

6. The method of claim 5, wherein the program loop is terminated when the verify voltage becomes higher than the first voltage.

7. A method of programming a plurality of memory cells in a flash memory device from a target state being between a first voltage and a second voltage, the method comprising:
    a) programming the plurality of memory cells to a first state lower than the target state;
    b) verifying the plurality of memory cells using a first verify voltage within a range of the first state;
    c) programming memory cells, each judged as a failed cell according to a verification result, using a program voltage increased by an increment corresponding to a difference between the second voltage and the verify voltage; and
    d) verifying the plurality of memory cells using a second verify voltage within a threshold voltage state determined according to the (c) step,
    wherein the (c) and (d) steps constitute a program loop, the program loop being repeated until the plurality of memory cells are programmed to have the target state.

8. The method of claim 7, wherein the first verify voltage has a voltage level corresponding to an intermediate value of a voltage range of the first state.

9. The method of claim 7, wherein the first verify voltage has a voltage level corresponding to one of a minimum value and an intermediate value in a voltage range of the first state.

10. The method of claim 7, wherein the program voltage is a pulse voltage increased by $\Delta Vi = Vx - Vvfy(i-1)$ with respect to the pulse voltage of a previous program loop, wherein Vx is the second voltage and $\Delta Vi$ is a verify voltage of a (i−1)th program loop.

11. The method of claim 10, wherein the second verify voltage (Vvfyi) is $((Vx - Vvfy(i-1))/2)$, wherein Vvfyi is a verify voltage of an ith program loop, Vvfy(i−1) is a verify voltage, and Vx is the second voltage.

12. The method of claim 10, wherein the (d) step is terminated at a point in time when the second voltage verify reaches a voltage higher than the first voltage.

* * * * *